(12) United States Patent
Hess et al.

(10) Patent No.: US 10,496,775 B2
(45) Date of Patent: Dec. 3, 2019

(54) METHOD AND SYSTEM FOR USE IN DYNAMICALLY CONFIGURING DATA ACQUISITION SYSTEMS

(71) Applicant: General Electric Company, Schenectady, NY (US)

(72) Inventors: Dustin Delany Hess, Minden, NV (US); Adam Anthony Weiss, Minden, NV (US); Jeremy David Fox, Carson City, NV (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 1488 days.

(21) Appl. No.: 13/755,168

(22) Filed: Jan. 31, 2013

(65) Prior Publication Data
US 2014/0214356 A1     Jul. 31, 2014

(51) Int. Cl.
*G06F 17/50* (2006.01)
(52) U.S. Cl.
CPC ................................ *G06F 17/5054* (2013.01)
(58) Field of Classification Search
None
See application file for complete search history.

(56) References Cited

U.S. PATENT DOCUMENTS

| | | | | |
|---|---|---|---|---|
| 6,357,429 B1* | 3/2002 | Carnevale | ............. | F02D 41/008 123/673 |
| 7,406,670 B1* | 7/2008 | Ansari | .................... | G06F 11/27 716/136 |
| 8,127,280 B2* | 2/2012 | Thomas | ................ | G06F 8/4442 717/136 |
| 8,175,850 B2* | 5/2012 | Nelson | ............... | G05B 23/0221 700/143 |
| 2003/0036876 A1* | 2/2003 | Fuller, III | ........... | G06F 9/44505 702/127 |
| 2003/0139196 A1* | 7/2003 | Medvedev | ........... | H04B 7/0443 455/522 |
| 2003/0149962 A1* | 8/2003 | Willis | ................. | G06F 17/5027 717/135 |

(Continued)

OTHER PUBLICATIONS

The CoreConnect™ Bus Architecture, Dec. 31, 1999, IBM.*

(Continued)

*Primary Examiner* — Gregory J Toatley, Jr.
*Assistant Examiner* — Brandon J Becker
(74) *Attorney, Agent, or Firm* — Mintz Levin Cohn Ferris Glovsky and Popeo, P.C.

(57) ABSTRACT

A data acquisition system (DAS) includes a plurality of processors comprising at least one first processor and a plurality of second processors. The at least one first processor is configured to receive at least one configuration file and generate at least one measurement data application from the at least one configuration file. The DAS also includes a field-programmable gate array (FPGA) coupled to the plurality of processors. The FPGA is configured to receive the at least one measurement data application and allocate at least a portion of one of the FPGA and at least one second processor of the plurality of second processors to calculate measurement data at least partially based on the at least one measurement data application and an availability of the at least a portion of the FPGA.

20 Claims, 7 Drawing Sheets

(56) References Cited

U.S. PATENT DOCUMENTS

| | | | | |
|---|---|---|---|---|
| 2006/0015313 | A1* | 1/2006 | Wang | G06F 17/5027 703/14 |
| 2007/0233821 | A1* | 10/2007 | Sullivan | G06F 11/142 709/220 |
| 2007/0280253 | A1* | 12/2007 | Rooholamini | H04L 45/00 370/395.2 |
| 2009/0302782 | A1* | 12/2009 | Smith | H05B 37/0245 315/297 |
| 2010/0023430 | A1* | 1/2010 | Hunter | G06Q 10/087 705/28 |
| 2010/0161255 | A1* | 6/2010 | Mian | G01N 29/041 702/56 |
| 2010/0225390 | A1* | 9/2010 | Brown | H03F 1/3247 330/149 |
| 2010/0332792 | A1* | 12/2010 | Clifton | G06F 9/3012 712/4 |
| 2011/0115717 | A1* | 5/2011 | Hable | G06F 3/0416 345/173 |
| 2011/0173224 | A1* | 7/2011 | Toledo | G06F 16/24556 707/769 |
| 2011/0190694 | A1* | 8/2011 | Lanier, Jr. | A61M 5/14216 604/67 |
| 2012/0179441 | A1* | 7/2012 | Anderson | G06F 1/206 703/6 |
| 2012/0289581 | A1* | 11/2012 | Chang | C12Q 1/6886 514/44 A |
| 2012/0290725 | A1* | 11/2012 | Podila | G06F 9/5011 709/226 |
| 2013/0170334 | A1* | 7/2013 | Koinuma | G06F 11/0724 370/216 |
| 2014/0085302 | A1* | 3/2014 | Doyle | G06T 15/005 345/423 |

OTHER PUBLICATIONS

International Search Report and Written Opinion issued in connection with corresponding PCT Application No. PCT/US2014/012640 dated Nov. 5, 2014.

Rodriguez et al., "Control electronic platform based on floating-point DSP and FPGA for a NPC multilevel back-to-back converter", Electric Power Systems Research, vol. No. 78, Issue No. 9, pp. 1597-1609, Sep. 1, 2008.

Wei et al., "The Design and Implementation of High-Speed Data Acquisition System Based on NIOS II", Computing, Control and Industrial Engineering (CCIE), 2010 International Conference on, IEEE, Piscataway, NJ, USA, pp. 334-336, Jun. 5, 2010.

Baofeng et al., "Design of high speed data acquisition system based on FPGA and DSP", Artificial Intelligence and Education (ICAIE), 2010 International Conference on, IEEE, Piscataway, NJ, USA, pp. 132-135, Oct. 29, 2010.

* cited by examiner

METHOD AND SYSTEM FOR USE IN DYNAMICALLY CONFIGURING DATA ACQUISITION SYSTEMS

BACKGROUND OF THE INVENTION

The present invention relates generally to monitoring systems, and more particularly, to a method and system for use in dynamically configuring a data acquisition system to accept and implement new and revised measurement configurations.

Many known data acquisition systems are implemented for monitoring of industrial equipment, including industrial machines and their components. Signal-generating components, such as sensors and transducers, are typically positioned on, or are otherwise positioned to be closely associated with, points of interest of the machines. The signal-generating components generate and transmit various signals representative of real-time machine conditions. Such signals facilitate providing data and information to operators to manage the condition of the machine, e.g., to maintain the machine within predetermined operating parameters. Also, for example, this information may be used to schedule machine repair outages or to alter machine operating conditions to maximize performance, efficiency, or machine life.

Many known industrial machines are placed into service for extended periods of time and are typically maintained in service until demand for the service subsides, or for maintenance activities. During operation of such industrial machines, the data information used to monitor the conditions of the machines may need to change based on emergent reasons, e.g., a desire to change the measurement parameters and/or to add measurements to the monitoring scheme. The measurement parameters that may be changed are, e.g., the data sampling rates, warning and alarm setpoints, and whether the data is integrated or not with other data.

Also, in many known data acquisition systems, traditional approaches to incorporating changes to existing monitoring parameters and/or adding additional monitoring points includes programming a new revision of firmware, testing the firmware on a test platform, removing the affected industrial equipment from service, and installing the firmware within the associated data acquisition system. Such approaches are time-consuming, resource-consuming, and require production with the affected industrial equipment to be temporarily curtailed.

BRIEF DESCRIPTION OF THE INVENTION

In one embodiment, a data acquisition system (DAS) is provided. The DAS includes a plurality of processors comprising at least one first processor and a plurality of second processors. The at least one first processor is configured to receive at least one configuration file and generate at least one measurement data application from the at least one configuration file. The DAS also includes a field-programmable gate array (FPGA) coupled to the plurality of processors. The FPGA is configured to receive the at least one measurement data application and allocate at least a portion of one of the FPGA and at least one second processor of the plurality of second processors to calculate measurement data at least partially based on the at least one measurement data application and an availability of the at least a portion of the FPGA.

In another embodiment, a method of monitoring an asset is provided. The method includes providing at least one first processor and a plurality of second processors and transmitting at least one configuration file to the at least one first processor. The method also includes extracting, by the at least one first processor, at least one measurement data application from the at least one configuration file, and transmitting the at least one measurement data application to a field-programmable gate array (FPGA). The method further includes allocating at least a portion of one of the FPGA and at least one second processor at least partially based on the at least one measurement data application and an availability of the at least a portion of the FPGA. The method also includes calculating asset measurement data within one of the FPGA and the at least one second processor and transmitting the asset measurement data to a storage device accessible to a user.

In yet another embodiment, an industrial facility that includes at least one industrial asset and a data acquisition system (DAS) is provided. The DAS includes at least one monitoring sensor coupled to the at least one asset. The at least one monitoring sensor is configured to transmit signals substantially representative of at least one asset measurement. The DAS also includes a plurality of processors including at least one first processor and a plurality of second processors. The at least one first processor is configured to receive at least one configuration file and generate at least one measurement data application from the at least one configuration file. The DAS also includes a field-programmable gate array (FPGA) coupled to the plurality of processors and the at least one monitoring sensor. The FPGA is configured to receive the at least one measurement data application and allocate at least a portion of one of the FPGA and at least one second processor of the plurality of second processors to calculate asset measurement data at least partially based on the at least one measurement data application and an availability of the at least a portion of the FPGA.

DETAILED DESCRIPTION OF THE INVENTION

Figure 1:
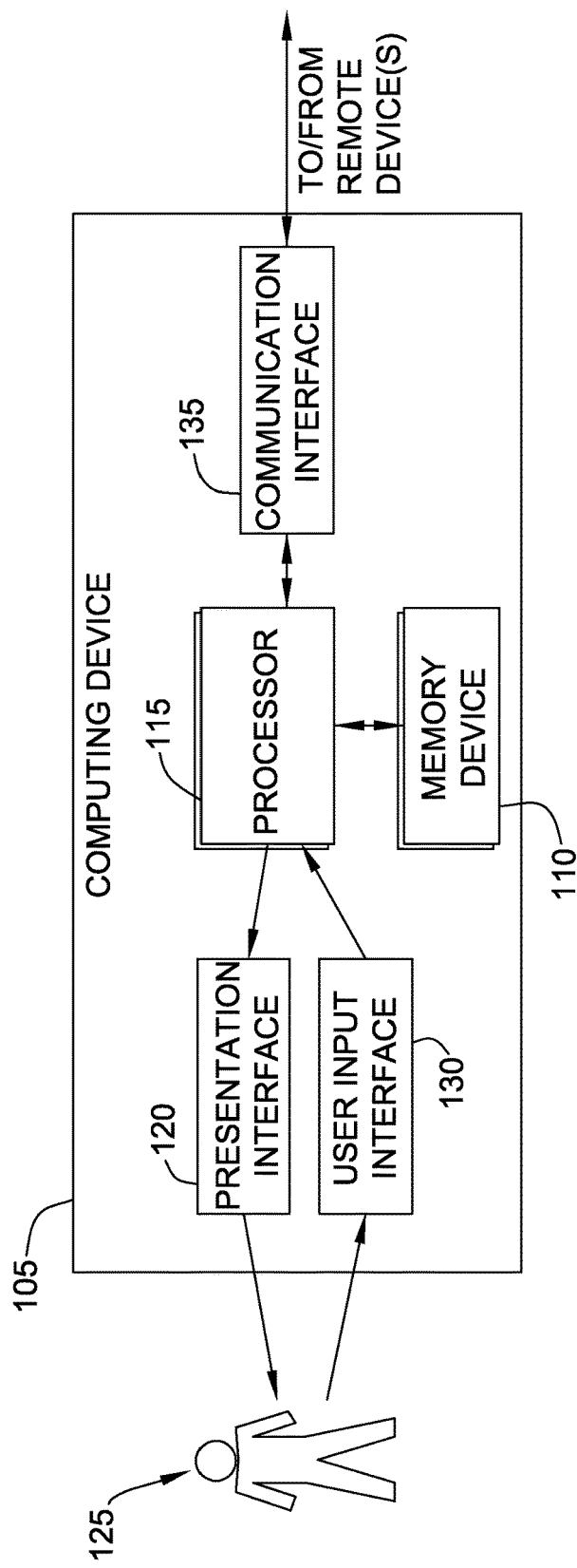
FIG. 1 is a block diagram of an exemplary computing device.

FIG. 1 is a block diagram of an exemplary computing device 105 that may be used to perform monitoring of industrial assets within an industrial facility. More specifically, any piece of equipment, system, and process i.e., components of an industrial asset (shown in FIG. 1), e.g., without limitation, a gas turbine engine (not shown in FIG. 1), including, without limitation, a compressor section, a combustor section, a turbine section, and an exhaust section (neither shown in FIG. 1). Computing device 105 includes a memory device 110 and a processor 115 operatively coupled to memory device 110 for executing instructions. Processor 115 may include one or more processing units, e.g., without limitation, in a multi-core configuration. In some embodiments, executable instructions are stored in memory device 110. Computing device 105 is configurable to perform one or more operations described herein by programming processor 115. For example, processor 115 may be programmed by encoding an operation as one or more executable instructions and providing the executable instructions in memory device 110. In the exemplary embodiment, memory device 110 is one or more devices that enable storage and retrieval of information such as executable instructions and/or other data. Memory device 110 may include one or more computer readable media, such as, without limitation, random access memory (RAM), dynamic random access memory (DRAM), static random access memory (SRAM), a solid state disk, a hard disk, read-only memory (ROM), erasable programmable ROM (EPROM), electrically erasable programmable ROM (EEPROM), and/or non-volatile RAM (NVRAM) memory. The above memory types are exemplary only, and are thus not limiting as to the types of memory usable for storage of a computer program.

As used herein, the term "computer" and related terms, e.g., "computing device", are not limited to integrated circuits referred to in the art as a computer, but broadly refers to a microcontroller, a microcomputer, a programmable logic controller (PLC), an application specific integrated circuit, and other programmable circuits (none shown in FIG. 1), and these terms are used interchangeably herein.

Further, as used herein, the terms "software" and "firmware" are interchangeable, and include any computer program stored in memory for execution by personal computers, workstations, clients and servers.

Moreover, as used herein, the term "non-transitory computer-readable media" includes all tangible, computer-readable media, such as a firmware, floppy disk, CD-ROMs, DVDs and another digital source such as a network or the Internet, as well as yet to be developed digital means, with the sole exception being a transitory, propagating signal.

Memory device 110 may be configured to store operational measurements including, without limitation, real-time and historical vibration values, and/or any other type data. In some embodiments, processor 115 removes or "purges" data from memory device 110 based on the age of the data. For example, processor 115 may overwrite previously recorded and stored data associated with a subsequent time and/or event. In addition, or alternatively, processor 115 may remove data that exceeds a predetermined time interval. Also, memory device 110 includes, without limitation, sufficient data, algorithms, and commands to facilitate monitoring and control of the components within an industrial asset.

As used herein, the term "real-time" refers to at least one of the time of occurrence of the associated events, the time of measurement and collection of predetermined data, the time to process the data, and the time of a system response to the events and the environment. In the embodiments described herein, these activities and events occur substantially instantaneously.

In some embodiments, computing device 105 includes a presentation interface 120 coupled to processor 115. Presentation interface 120 presents information, such as a user interface and/or an alarm, to a user 125. In one embodiment, presentation interface 120 includes a display adapter (not shown) that is coupled to a display device (not shown), such as a cathode ray tube (CRT), a liquid crystal display (LCD), an organic LED (OLED) display, and/or an "electronic ink" display. In some embodiments, presentation interface 120 includes one or more display devices. In addition, or alternatively, presentation interface 120 includes an audio output device (not shown) (e.g., an audio adapter and/or a speaker) and/or a printer (not shown). In some embodiments, presentation interface 120 presents an alarm associated with the gas turbine engine being monitored, such as by using a human machine interface (HMI) (not shown in FIG. 1).

In some embodiments, computing device 105 includes a user input interface 130. In the exemplary embodiment, user input interface 130 is coupled to processor 115 and receives input from user 125. User input interface 130 may include, for example, a keyboard, a pointing device, a mouse, a stylus, a touch sensitive panel, e.g., without limitation, a touch pad or a touch screen, and/or an audio input interface, e.g., without limitation, a microphone. A single component, such as a touch screen, may function as both a display device of presentation interface 120 and user input interface 130.

A communication interface 135 is coupled to processor 115 and is configured to be coupled in communication with one or more other devices, such as a sensor or another computing device 105, and to perform input and output operations with respect to such devices while performing as an input channel. For example, communication interface 135 may include, without limitation, a wired network adapter, a wireless network adapter, a mobile telecommunications adapter, a serial communication adapter, and/or a parallel communication adapter. Communication interface 135 may receive data from and/or transmit data to one or more remote devices. For example, a communication interface 135 of one computing device 105 may transmit an alarm to the communication interface 135 of another computing device 105.

Presentation interface 120 and/or communication interface 135 are both capable of providing information suitable for use with the methods described herein (e.g., to user 125 or another device). Accordingly, presentation interface 120 and communication interface 135 may be referred to as output devices. Similarly, user input interface 130 and communication interface 135 are capable of receiving information suitable for use with the methods described herein and may be referred to as input devices.

Figure 2:
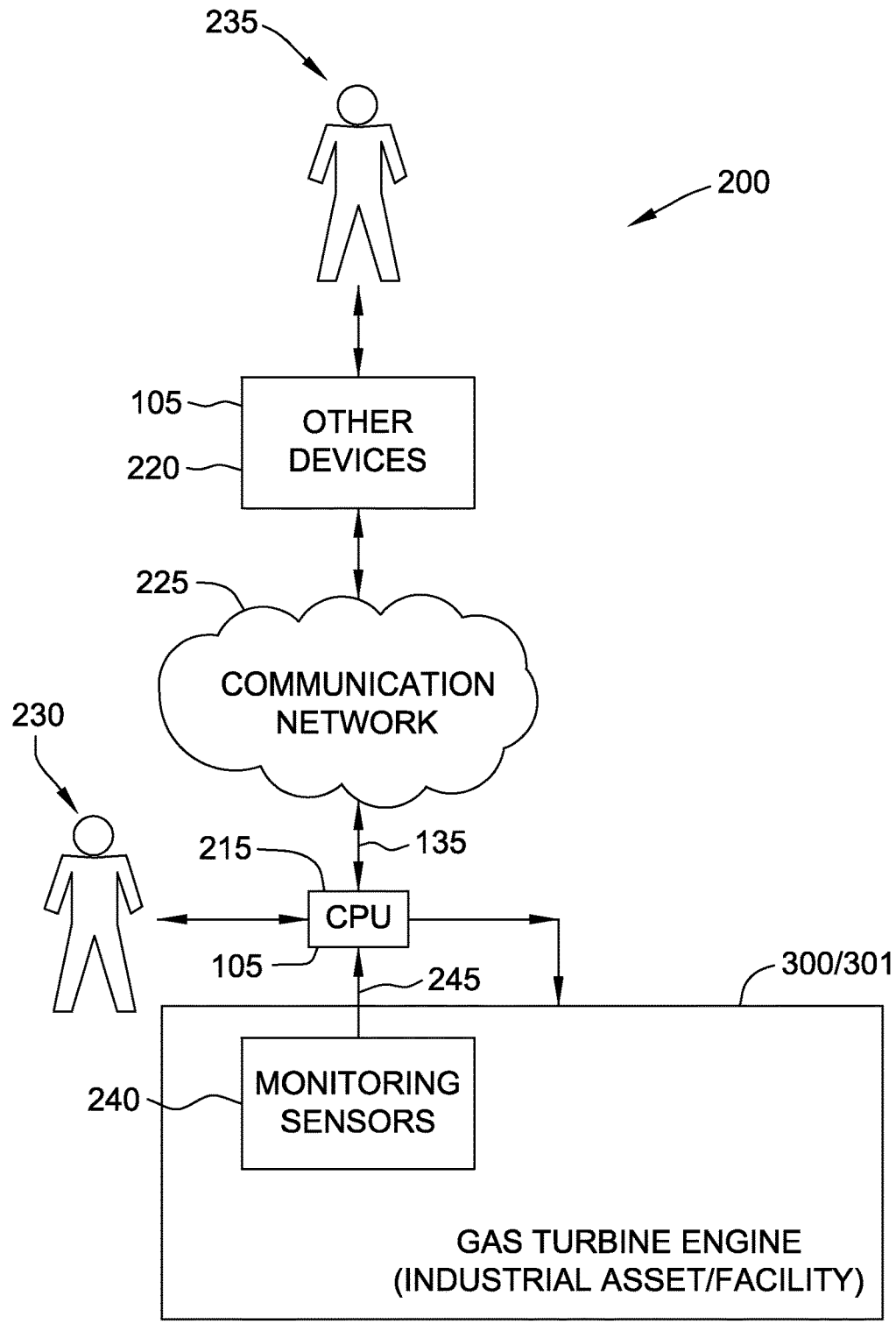
FIG. 2 is block diagram of a portion of an exemplary data acquisition system (DAS) that may include the computing device shown in FIG. 1.

FIG. 2 is block diagram of a portion of a monitoring system, i.e., in the exemplary embodiment, a data acquisition system (DAS) 200 that may be used to monitor and control at least a portion of an industrial facility 301 that includes at least one industrial asset, i.e., a turbomachine, and more specifically, in the exemplary embodiment, a gas turbine engine 300. Alternatively, industrial facility 301 may include a plurality of gas turbine engines 300. Also, alternatively, industrial facility 301 may include any number of heat recovery steam generators and/or steam turbines (neither shown). Further, alternatively, any apparatus, system, and facility may be monitored and/or controlled using a system substantially similar to DAS 200 as described herein, including, without limitation, fossil-fired power plants, nuclear power plants, chemical processing facilities, oil refineries, food processing facilities, and renewable energy facilities, e.g., without limitation, wind, solar, and geothermal, including their associated power converters.

In the exemplary embodiment, DAS 200 includes at least one central processing unit (CPU) 215 configured to execute monitoring algorithms and monitoring logic. CPU 215 may be coupled to other devices 220 via a communication network 225. CPU 215 may be, without limitation, a facility-level centralized CPU, a plant-level centralized CPU, one of a plurality of distributed CPUs, and a portable CPU. Alternatively, DAS 200 includes at least one central processing unit (CPU) 215 configured to execute control algorithms and control logic. CPU 215 may be, without limitation, a facility-level centralized controller, a plant-level centralized controller, one of a plurality of distributed controllers, and a portable controller. Also, alternatively, data acquisition system 200 merely provides data inputs to a separate CPU, or controller.

Embodiments of network 225 may include operative coupling with, without limitation, the Internet, a local area network (LAN), a wide area network (WAN), a wireless LAN (WLAN), and/or a virtual private network (VPN). While certain operations are described below with respect to particular computing devices 105, it is contemplated that any computing device 105 may perform one or more of the described operations. For example, CPU 215 may perform all of the operations below.

Referring to FIGS. 1 and 2, CPU 215 is a computing device 105. In the exemplary embodiment, computing device 105 is coupled to network 225 via communication interface 135. In an alternative embodiment, CPU 215 is integrated with other devices 220.

As used herein, the terms "controller", "control system", and "processor" include any programmable system including systems and microcontrollers, reduced instruction set circuits, application specific integrated circuits, programmable logic circuits, and any other circuit capable of executing the functions described herein. The above examples are exemplary only, and thus are not intended to limit in any way the definition and/or meaning of the term processor. Moreover, CPU 215 may include sufficient processing capabilities to execute support applications including, without limitation, a Supervisory, Control, and Data Acquisition (SCADA) system. Moreover, in some embodiments, at least a portion of data acquisition system 200 and additional portions (not shown) may be implemented within a broader control system (not shown) that enables operation of gas turbine engine 300 as described herein, including, without limitation, those processors resident within personal computers, remote servers, programmable logic controllers (PLCs), distributed control system (DCS) cabinets, and hand-held Internet-enabled devices.

CPU 215 interacts with a first operator 230, e.g., without limitation, via user input interface 130 and/or presentation interface 120. In one embodiment, CPU 215 presents information about gas turbine engine 300, such as alarms, to operator 230. Other devices 220 interact with a second operator 235, e.g., without limitation, via user input interface 130 and/or presentation interface 120. For example, other devices 220 present alarms and/or other operational information to second operator 235. As used herein, the term "operator" includes any person in any capacity associated with operating and maintaining gas turbine engine 300, including, without limitation, shift operations personnel, maintenance technicians, and facility supervisors.

In the exemplary embodiment, gas turbine engine 300 includes one or more monitoring sensors 240 coupled to CPU 215 through at least one input channel 245. Monitoring sensors 240 collect operational measurements including, without limitation, rotational speeds of a drive shaft (not shown in FIG. 2) and temperatures of a combustion gas exhaust stream (not shown in FIG. 2) generated within gas turbine engine 300. Monitoring sensors 240 repeatedly, e.g., periodically, continuously, and/or upon request, transmit operational measurement readings at the time of measurement. CPU 215 receives and processes the operational measurement readings. Such data is transmitted across network 225 and may be accessed by any device capable of accessing network 225 including, without limitation, desktop computers, laptop computers, and personal digital assistants (PDAs) (neither shown). In alternative embodiments, CPU 215 includes, without limitation, sufficient data, algorithms, and commands to facilitate control of the shaft speed and temperatures of the combustion exhaust gas stream.

In the exemplary embodiment, monitoring sensors 240 may generate a large volume of data. Therefore, other devices 220 includes at least one data server with a database and storage system that enables operation of gas turbine engine 300 and DAS 200 as described herein.

Figure 3:
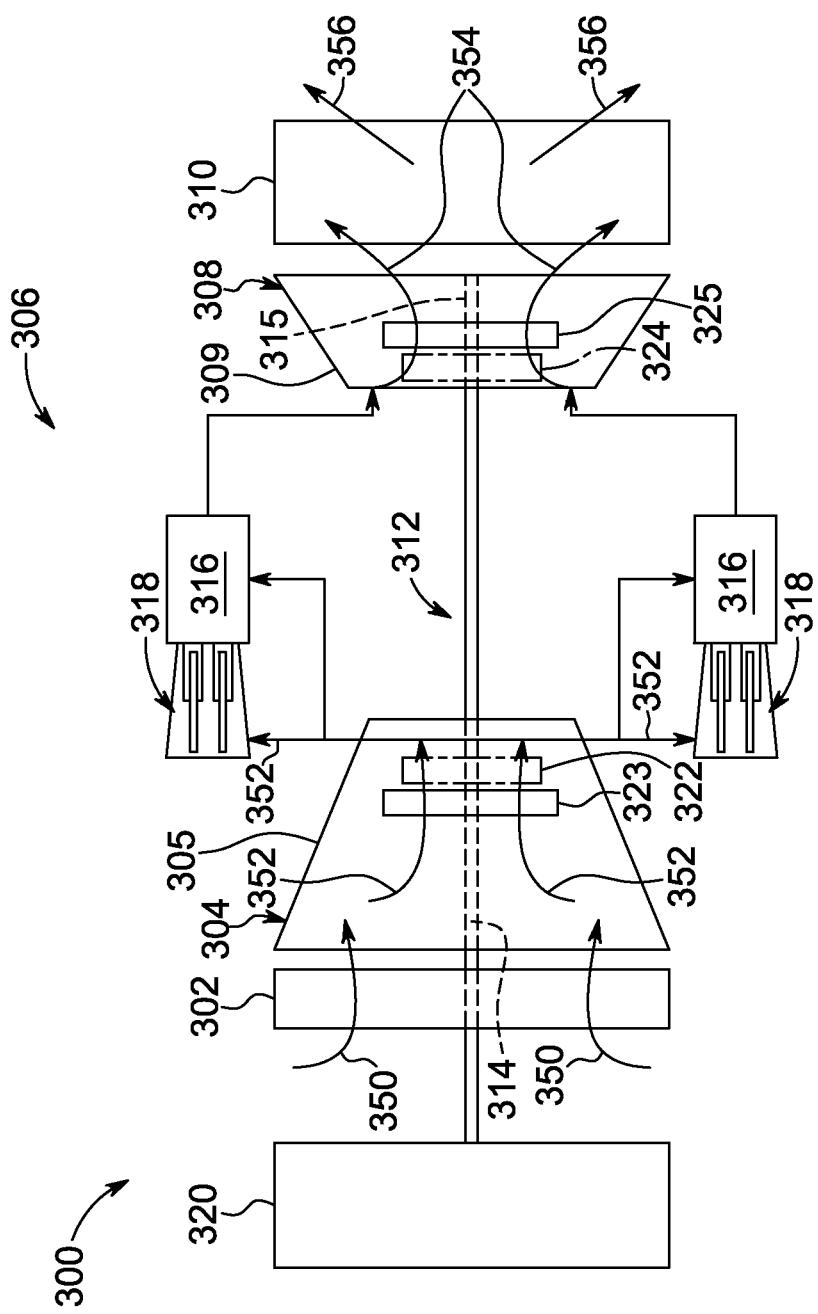
FIG. 3 is schematic diagram of an exemplary gas turbine engine that may be monitored using the DAS shown in FIG. 2.

FIG. 3 is a schematic view of at least a portion of an industrial asset, i.e., a turbomachine, and more specifically, in the exemplary embodiment, a gas turbine engine 300. Alternatively, any apparatus, system, and facility may be monitored and/or controlled using a system substantially similar to DAS 200 as described herein, including, and without limitation, fossil-fired power plants, nuclear power plants, chemical processing facilities, oil refineries, and food processing facilities.

In the exemplary embodiment, gas turbine engine 300 includes an air intake section 302, and a compressor section 304 that is coupled downstream from, and in flow communication with, intake section 302. Compressor section 304 is enclosed within a compressor casing 305. A combustor section 306 is coupled downstream from, and in flow communication with, compressor section 304, and a turbine section 308 is coupled downstream from, and in flow communication with, combustor section 306. Gas turbine engine 300 is enclosed within a turbine casing 309 and includes an exhaust section 310 that is downstream from turbine section 308. Moreover, in the exemplary embodiment, turbine section 308 is coupled to compressor section 304 via a rotor assembly 312 that includes, without limitation, a compressor rotor, or drive shaft 314 and a turbine rotor, or drive shaft 315.

In the exemplary embodiment, combustor section 306 includes a plurality of combustor assemblies, i.e., combustors 316 that are each coupled in flow communication with compressor section 304. Combustor section 306 also includes at least one fuel nozzle assembly 318. Each combustor 316 is in flow communication with at least one fuel nozzle assembly 318. Moreover, in the exemplary embodiment, turbine section 308 and compressor section 304 are rotatably coupled to a load 320 via drive shaft 314. For example, load 320 may include, without limitation, an electrical generator and/or a mechanical drive application, e.g., a pump. Alternatively, gas turbine engine 300 may be an aircraft engine. In the exemplary embodiment, compressor section 304 includes at least one compressor blade assembly 322, i.e., blade 322 and at least one adjacent stationary vane assembly 323.

Also, in the exemplary embodiment, turbine section 308 includes at least one turbine blade assembly, i.e., bucket 324 and at least one adjacent stationary nozzle assembly 325. Each compressor blade assembly 322 and each turbine bucket 324 is coupled to rotor assembly 312, or, more specifically, compressor drive shaft 314 and turbine drive shaft 315.

In operation, air intake section 302 channels air 350 towards compressor section 304. Compressor section 304 compresses inlet air 350 to higher pressures and temperatures prior to discharging compressed air 352 towards combustor section 306. Compressed air 352 is channeled to fuel nozzle assembly 318, mixed with fuel (not shown), and burned within each combustor 316 to generate combustion gases 354 that are channeled downstream towards turbine section 308. Combustion gases 354 generated within combustors 316 are channeled downstream towards turbine section 308. After impinging turbine bucket 324, thermal energy is converted to mechanical rotational energy that is used to drive rotor assembly 312. Turbine section 308 drives compressor section 304 and/or load 320 via drive shafts 314 and 315, and exhaust gases 356 are discharged through exhaust section 310 to ambient atmosphere.

Figure 4:
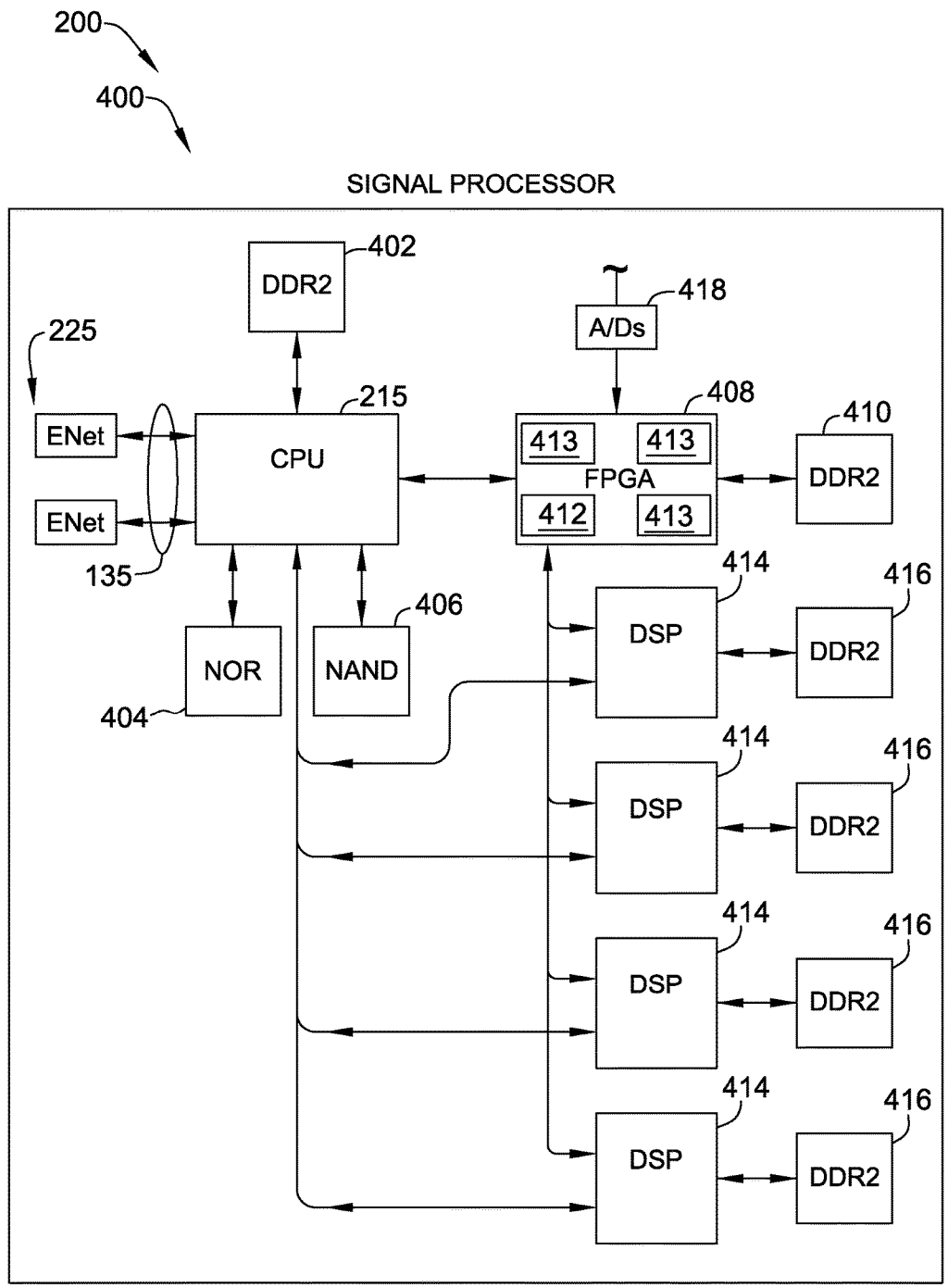
FIG. 4 is a block diagram of an exemplary signal processing portion of the DAS shown in FIG. 2.

FIG. 4 is a block diagram of an exemplary signal processing portion of DAS 200, i.e., signal processor 400. In the exemplary embodiment, signal processor 400 includes central processing unit (CPU) 215 configured with a processing speed of approximately 667 MegaHertz (MHz). Alternatively, CPU 215 is configured with any processor with any processing speed that enables operation of signal processor 400 as described herein. CPU 215 is coupled to a memory module 402. In the exemplary embodiment, memory module 402 is a double data rate type two (DDR2) synchronous dynamic random-access memory (SDRAM) device. Alternatively, module 402 is any memory device that enables operation of signal processor 400 as described herein, including, without limitation, a DDR type 3 (DDR3) SDRAM device.

CPU 215 is also coupled to at least one communication network 225 through communication interface 135 that is, in the exemplary embodiment, a plurality of Ethernet® (ENet) conduits. Alternatively, communication interface 135 includes any communication conduits using any configurations and any protocols that enable operation of signal processor 400 as described herein. CPU 215 is further coupled to a plurality of nonvolatile memory devices, i.e., a 128 Megabyte (MB) NOR flash device 404 and a 2 Gigabyte (GB) NAND flash device 406. Alternatively, flash devices 404 and 406 may be any size that enables operation of signal processor 400 as described herein. Therefore, CPU 215 facilitates communication with the "outside world" through communication interface 135, including devices programmed with configuration software for DAS 200. In the exemplary embodiment, such configuration software will download to CPU 215 as files in an extensible markup language-based (XML-based) configuration and CPU 215 translates the configuration files and extracts measurement data applications that signal processor 400 recognizes. The measurement data applications include, without limitation, the algorithms and instructions necessary to calculate measurement data from signals transmitted from monitoring sensors 240 (shown in FIG. 2). Alternatively, the configuration files may have any format that enables operation of signal processor 400 as described herein, including, without limitation, plain text and binary languages. Also, CPU 215 provides a firmware-to-software interface that facilitates translating the configuration files to the measurement data applications and operating on the measurement data received from monitoring sensors 240.

Also, in the exemplary embodiment, signal processor 400 includes a field-programmable gate array (FPGA) 408 coupled to CPU 215. FPGA 408 is coupled to a memory module 410. In the exemplary embodiment, memory module 410 is a 256 MB DDR2 SDRAM device. Alternatively, module 410 is any memory device that enables operation of signal processor 400 as described herein, including, without limitation, a DDR3 SDRAM device. FPGA 408 is configured to facilitate a standard suite of algorithms and instructions that approximately 90% of the measurement data applications will use. The remaining approximately 10% of the measurement data applications, new and/or non-standard and/or untested, are discussed below.

FPGA 408 includes an embedded soft core processor 412. In the exemplary embodiment, FPGA 408 is an Arria® II GX FPGA and embedded soft core processor 412 is a NIOS® II processor, both commercially available from Altera®, San Jose, Calif., U.S.A. Alternatively, any FPGA 408 and any embedded soft core processor 412 using any architecture and configuration that enable operation of signal processor 400 as described herein. FPGA 408 also includes a plurality of signal processing cores 413 (three shown) that calculate at least some of the measurement data transmitted from monitoring sensors 240.

Further, in the exemplary embodiment, signal processor 400 includes a plurality of processors 414 (four shown) each coupled in parallel with CPU 215 and FPGA 408. Moreover, in the exemplary embodiment, processors 414 are digital signal processors (DSPs) 414, for example, and without limitation, model TMS320C6748 fixed/floating point, 375 MHz, digital signal processors commercially available from Texas Instruments, Dallas, Tex., U.S.A. DSPs 414 are configured to use floating point math. Alternatively, processors 414 may be any processing devices that enable operation of signal processor 400 as described herein, including, without limitation, those processors based on advanced RISC machine (ARM) architectures, where RISC is an acronym for reduced instruction set computing.

DSPs 414 and FPGA 408 have a predetermined relationship. In the exemplary embodiment, DSPs 414 functions as floating point co-processors to FPGA 408. FPGA 408 and DSPs 414 are coupled through any bus interface architectures that enable operation of FPGA 408 and DSPs 414 as described herein, including, without limitation, serial advanced technology attachment (SATA). DSPs 414 will be the "master" of this interface making FPGA 408 function in a manner similar to a hard disk. Since DSPs 414 are the "master", FPGA 408 is configured with a mailbox-type architecture and such that messages are placed in a region of associated memory and DSPs 414 poll the mailbox for message transfer. Embedded soft core processor 412 deposits binary measurement configurations into the mailbox and such that DSPs 414 may read those configurations, process them, and acknowledge the configuration process. DSPs 414 will also have to write data to a database associated with FPGA 408. DSPs 414 will also read data from data sources associated with FPGA 408 to feed data to the measurement processor therein.

Soft core processor 412, FPGA 408, and CPU 215 also have a predetermined relationship. In the exemplary embodiment, soft core processor 412 has a mailbox in FPGA 408 that CPU 215 can write to. For each configuration object, CPU 215 will write it to the mailbox for soft core processor 412 and wait for an acknowledgement. Every configuration object will have a type, ID, action, and length header, as well as a CRC for validation purposes. Soft core processor 412 consistently polls the mailbox and when it receives a new configuration object command it will read the configuration object from the mailbox and interpret it. Once it has been either successfully configured or rejected, as in the case of an unrecognized configuration object, soft core processor 412 will place the result in the mailbox where CPU 215 can act on the possible error. CPU 215 will then send the next configuration object to the mailbox until all configuration objects are transferred. As such, CPU 215 can write new configuration objects to soft core processor 412 at any time, thereby supporting initial configuration and on-the-fly configurations (discussed further below).

Each of DSPs 414 is coupled to a memory module 416. In the exemplary embodiment, memory module 416 is a 64 MB DDR2 SDRAM device. Alternatively, module 416 is any memory device that enables operation of signal processor 400 as described herein, including, without limitation, a DDR3 SDRAM device.

Therefore, signal processor 400 includes a plurality of processors 215, 412, and 414. Also, signal processor 400 includes any combination of bus interface architectures that enables operation of signal processor 400 as described herein, including, without limitation, peripheral component interconnect express (PCIe), serial peripheral interface (SPI) bus, and serial advanced technology attachment (SATA).

In at least some aspects, embedded soft core processor 412 acts like the "brain" of signal processor 400, i.e., embedded soft core processor 412 is responsible for allocating resources to provide the measurements that signal processor 400 was configured for. More specifically, embedded soft core processor 412 interprets each measurement and then decides which resources to allocate to calculate that measurement. Embedded soft core processor 412 has two main forms of resources it can allocate to the calculation of the measurement. The first resource includes at least one of signal processing cores 413 on FPGA 408. The second is a generic signal processing engine (not shown) embedded within each of DSPs 414.

Moreover, in the exemplary embodiment, signal processor 400 further includes at least one analog-to-digital (A/D) converter 418 (only one shown) that is coupled to monitoring sensors 240. Alternatively, A/D converter 418 is a portion of an external signal conditioning system (not shown in FIG. 4) external to signal processor 400.

Figure 5:
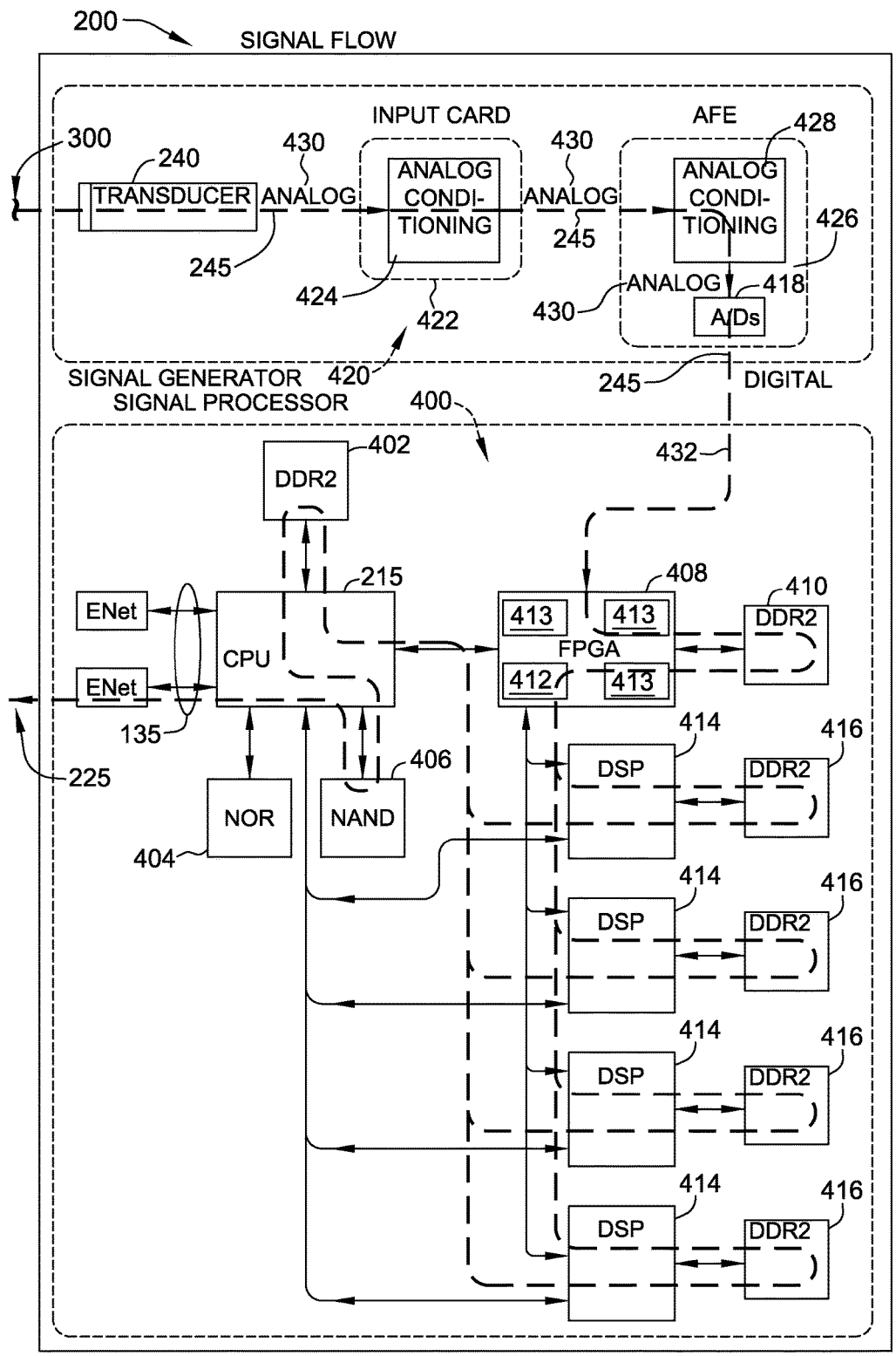
FIG. 5 is a block diagram of the signal processing portion shown in FIG. 4 coupled to a signal generation portion of the DAS shown in FIG. 2.

FIG. 5 is a block diagram of signal processor 400 coupled to a signal generation portion, i.e., signal generator 420 of DAS 200. In the exemplary embodiment, signal generator 420 is coupled to signal processor 400 through input channel 245. Signal generator 420 includes monitoring sensor 240, e.g., without limitation, a transducer. Signal generator 420 also includes an input card 422 that includes a first analog conditioning module 424 coupled to monitoring sensor 240 through input channel 245. Signal generator 420 further includes an analog front end (AFE) card 426 that includes a second analog conditioning module 428 coupled to first analog conditioning module 424 through input channel 245. In this exemplary embodiment, A/D converter 418 is positioned on AFE card 426 and is coupled to FPGA 408 through input channel 245.

In operation, monitoring sensor 240 generates and transmits an analog signal 430 that includes measurement data that is substantially representative of a monitored portion of a portion of a system and/or process, e.g., a rotational velocity of rotor assembly 312 of gas turbine engine 300 (both shown in FIG. 3). Analog signal 430 is transmitted to first and second analog conditioning modules 424 and 428, respectively, and to A/D converter 418. A/D converter 418 generates and transmits a digital signal stream 432 to FPGA 408 at any frequency that enables operation of signal processor 400 as described herein, including, without limitation, 102.4 Kilohertz (kHz).

Also, in operation, FPGA 408 and associated memory module 410 perform at least a portion of data analysis on digital signal stream 432, including, without limitation, spectrum analysis. At least a portion of digital signal stream 432 may be transmitted directly to CPU 215 from FPGA 408 to perform at least a portion of data analysis with associated memory module 402, including, without limitation, analyzing asynchronous waveforms. Further, at least a portion of digital signal stream 432 may be transmitted to at least one of DSPs 414 and their associated memory modules 416 from FPGA 408 to perform at least a portion of data analysis, including, without limitation, bandpass-filtered variables. The results of analyses performed by DSPs 414 and FPGA 408 are transmitted to CPU 215 for further processing. The results of the analyses are transmitted to communication network 225 through communication interface 135 for further processing and/or display.

Figure 6:
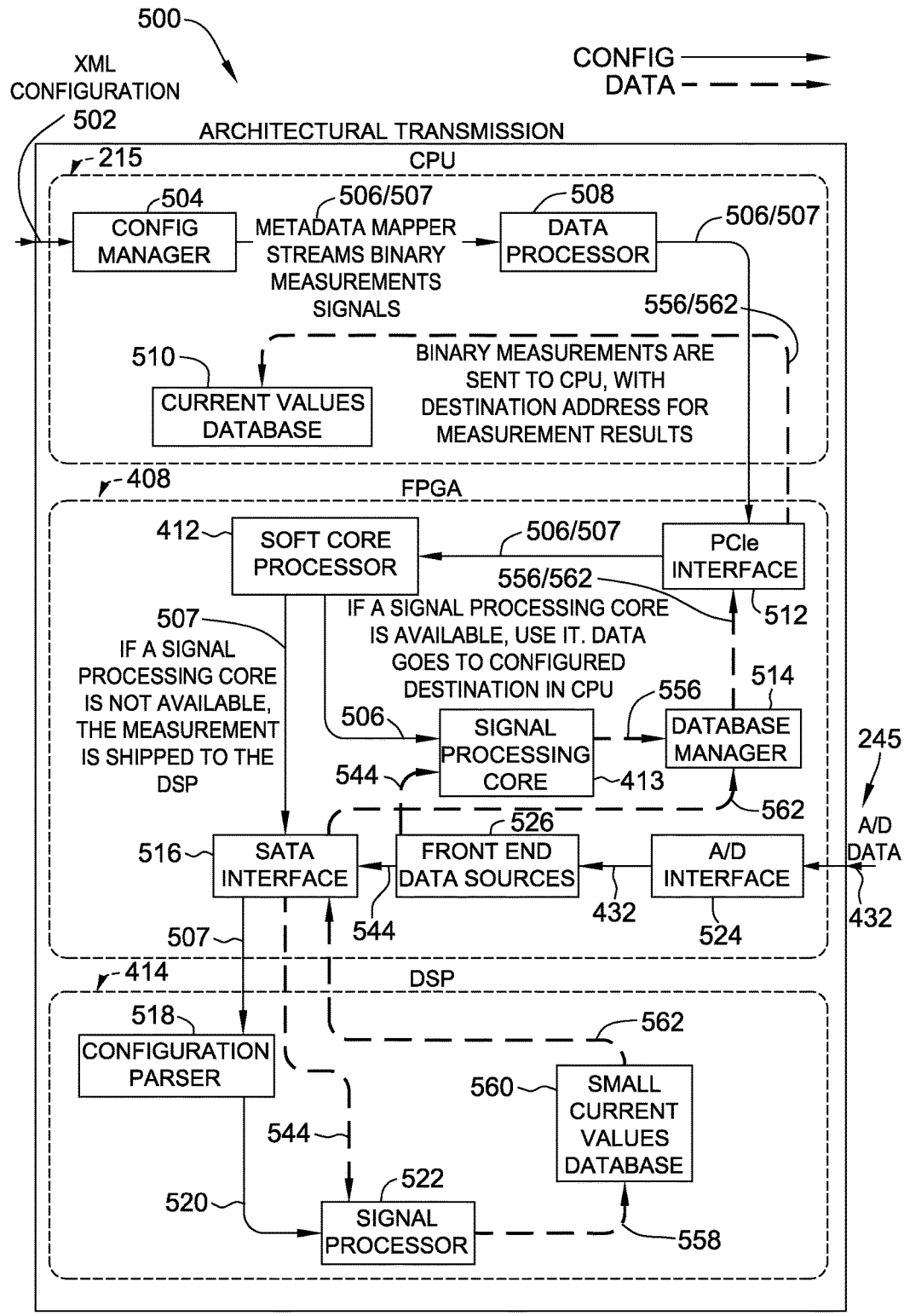
FIG. 6 is a block diagram of configuration and measurement data transmission through the signal processing portion shown in FIG. 4.

FIG. 6 is a block diagram of configuration and measurement data transmission 500 through the architecture at least partially defined by signal processing portion 400 (shown in FIGS. 4 and 5). In the exemplary embodiment, at least one XML configuration file 502 is transmitted to a configuration manager module 504 embedded within CPU 215. Each XML configuration file 502 is configured with measurement data applications with properties that include, without limitation, parameters for high pass and low pass filtering, peak detection, ripple filtering, and static variable determinations. Configuration manager module 504 translates each XML configuration file 502 and extracts a plurality of binary-structured measurement data application configuration signals 506/507 through metadata mapping algorithms. The distinction between signals 506 and 507 is discussed below. Such translation from XML configuration file 502 to measurement data application configuration signals 506/507 is data driven off of Metadata to allow new measurements to be added easily. Measurement data application configuration signals 506/507 are transmitted to a data processor 508 embedded within CPU 215. Data processor 508 facilitates allocating a location for measurement results within a current values database 510 embedded within CPU 215. Alternatively, current values database 510 may be implemented in any other device that enables operation of signal processor 400 as described herein, including, without limitation, a database server.

Also, in the exemplary embodiment, measurement data application configuration signals 506/507 are transmitted from CPU 215 to FPGA 408 through a PCIe interface module 512 to embedded soft core processor 412. Alternatively, any bus interface architectures that enable operation of signal processor 400 as described herein may be used. Soft core processor 412 interprets the associated measurement configuration data within signals 506/507 and makes a determination if any of signal processing cores 413 (only one shown in FIG. 6) are available to make the associated measurement calculations and if cores 413 are sufficiently advanced and/or configured to execute the associated calculations based on the associated measurement configuration data within signals 506/507.

Further, in the exemplary embodiment, for those circumstances where both of the conditions of availability and configuration of signal processing core 413 are met, a first portion of signals 506/507 is defined. Specifically, signals 506 with the measurement configuration data are transmitted to an available signal processing core 413. If the associated measurement data calculations are relatively common, as are approximately 90% of the expected measurement data calculations, one of signal processing cores 413 will likely be configured for that measurement. Therefore, soft core processor 412 allocates such signal processing core 413 within FPGA 408 to calculate the associated measurements and configures core 413 with the associated measurement configuration data. Once soft core processor 412 allocates the resources to calculate the measurement data, it will acknowledge to CPU 215 that the resources have been allocated. Once the processing resources have been allocated, the measurement data is calculated and transferred to memory 402 of CPU 215 such that CPU 215 can determine the proper actions to take, if any, based on such measurement data.

Soft core processor 412 also configures a FPGA database manager 514 to facilitate receiving and, at least temporarily, locally storing measurement data therein (described further below). FPGA database manager 514 is also configured to maintain a list of direct memory access (DMA) segment descriptors. Such DMA interface features are configured to facilitate certain hardware subsystems within signal processing portion 400 to access system memory modules 402, 410, and 416 independently of CPU 215, thereby facilitating a reduction in processing overhead and an increase in data throughput. The DMA segment descriptors are maintained within FPGA 408 until a periodic DMA transfer takes place, at which time the measurement configuration data will direct the CPU's DMA engine within CPU 215, via its DMA segment descriptor, where the measurement data result will come from in FPGA's memory module 410 and where the measurement data result will go in CPU memory module 402 (as discussed further below). While the exemplary embodiments described herein are configured with DMA interface features, alternative embodiments may use interface features in which all data transmitted between the hardware subsystems within signal processing portion 400 are transmitted through CPU 215, including, without limitation, programmed input/output (PIO) interface features.

Moreover, in the exemplary embodiment, for those circumstances where at least one of either of the two conditions of availability and configuration is not met for any of signal processing cores 413 within FPGA 408, a second portion of signals 506/507 is defined. Specifically, signals 507 with the measurement configuration data are transmitted to one of four DSPs 414 through a SATA interface module 516 embedded in FPGA 408. Such signals are hereon referred to as signals 507. Approximately 10% of the measurement data calculations are not foreseeable and/or are highly customizable. Therefore, for measurement configuration data that cannot be processed by any FPGA signal processing core 413, the soft core processor 412 will transmit the measurement configuration data and destination address (just as both were received) to one of four DSPs 414. Measurement data application configuration signals 507 are transmitted to a configuration parser module 518 to parse the measurement configuration data. As used herein, the terms "parse" and "parsing" are used to mean the processing, analysis, and breakdown of the measurement configuration data into individual measurement data configuration constituents, i.e., signal processing object chains 520 that include individual measurement application properties, e.g., without limitation, parameters for high pass and low pass filtering, peak detection, ripple filtering, and static variable determinations. As such, signal processing object chains 520 are transmitted from configuration parser module 518 to a signal processor 522 that configures a signal processing object tree to facilitate calculating the measurement data with the data measurement application properties.

Therefore, soft core processor 412 allocates such DSP 414 to calculate the associated measurements and configures such DSP 414 with the associated measurement configuration data. As described above for FPGA 408, once soft core processor 412 allocates the resources to calculate the measurement data, it will acknowledge to CPU 215 that the resources have been allocated. For the much less common condition that the measurement data application cannot be configured within a DSP 414, a notification will be transmitted to soft core processor 412 and then to CPU 215. Soft core processor 412 also configures FPGA database manager 514 to facilitate receiving and, at least temporarily, locally storing measurement data therein (described further below). FPGA database manager 514 is also configured to maintain a list of direct memory access (DMA) segment descriptors. Such DMA is configured to facilitate certain hardware subsystems within signal processing portion 400 to access system memory modules 402, 410, and 416 independently of CPU 215. Such DMA segment descriptors are maintained within FPGA 408 until a periodic DMA transfer takes place. The measurement configuration data will direct the CPU's DMA engine within CPU 215, via its DMA segment descriptor, to transmit the measurement data result from FPGA's memory module 410 to CPU memory module 402 (as discussed further below). Once the measurement is set up in DSP 414, it will read data from the configured data source, run it through the measurement tree, and then store the result back into the FPGA's database manager 514 where that measurement can be transmitted to CPU 215 at the configured destination address.

Also, in the exemplary embodiment, monitoring sensor 240 (shown in FIGS. 2 and 5) generates and transmits an analog signal 430 (shown in FIG. 5) that includes measurement data that is substantially representative of a monitored portion of a portion of a system and/or process, e.g., a rotational velocity of rotor assembly 312 of gas turbine engine 300 (both shown in FIG. 3). Analog signal 430 is transmitted to A/D converter 418 (shown in FIG. 5). A/D converter 418 generates and transmits a digital signal stream 432 to an A/D interface module 524 embedded within FPGA 408. Digital signal stream 432 is transmitted to a front end data sources module 526.

Figure 7:
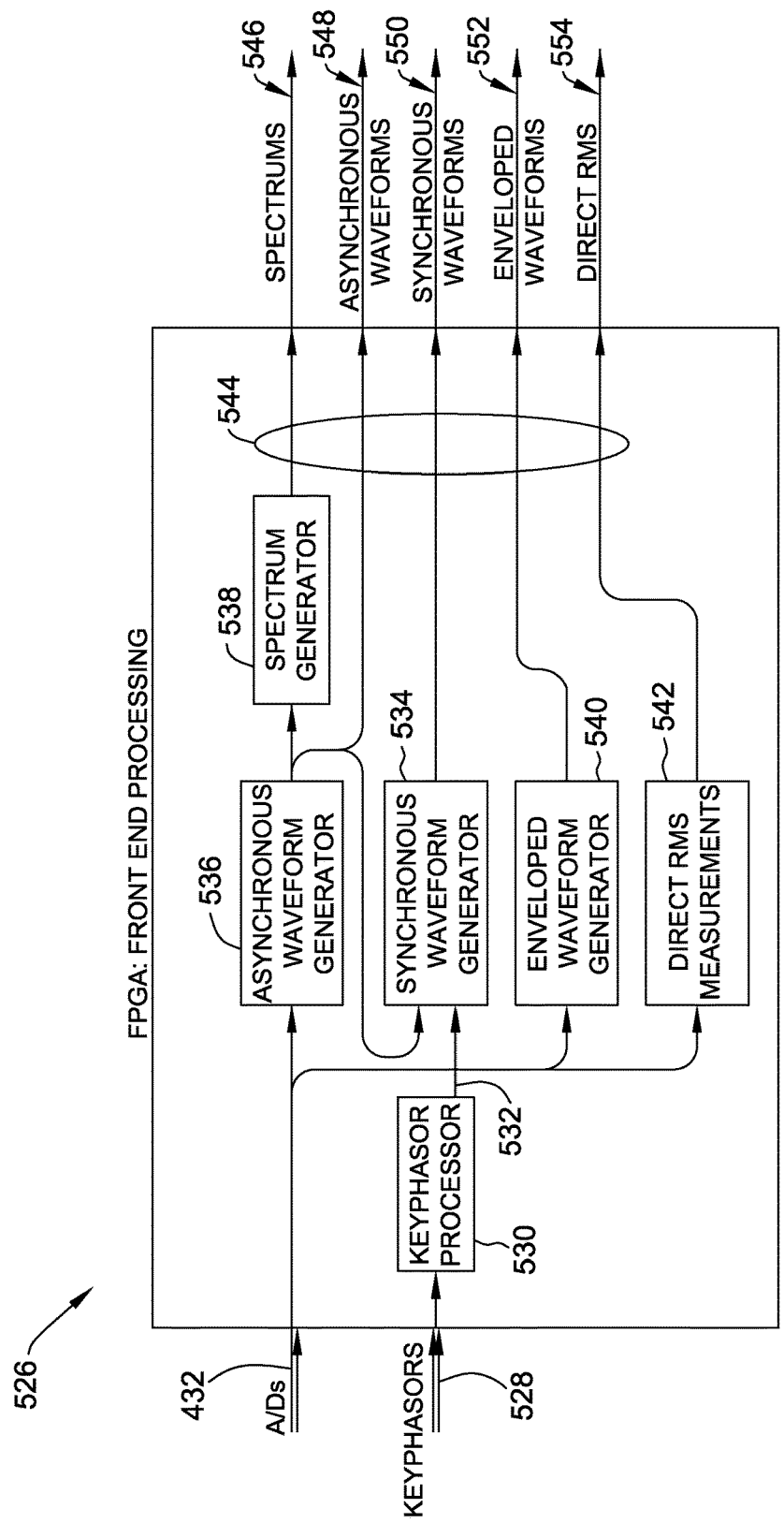
FIG. 7 is a block diagram of an exemplary front end data source module that may be used to process incoming measurement data signals in the signal processing portion shown in FIGS. 4 and 5.

FIG. 7 is a block diagram of front end data sources module 526 configured to process incoming measurement data signals, i.e., digital signal stream 432 within FPGA 408 (shown in FIGS. 4, 5, and 6). In the exemplary embodiment, a keyphasor signal stream 528 is transmitted into module 526 from a phase reference probe, i.e., a keyphasor transducer (not shown) that generates one large pulse per revolution of rotor assembly 312 of gas turbine engine 300 (both shown in FIG. 3) as a timing reference mark on rotor assembly 312. Keyphasor signal stream 528 is transmitted to a keyphasor processor 530 that generates and transmits a processed keyphasor signal stream 532 that is transmitted to a synchronous waveform generator submodule 534 embedded within module 526.

In addition to synchronous waveform generator submodule 534, front end data sources module 526 also includes an asynchronous waveform generator submodule 536, a spectrum generator submodule 538, an enveloped waveform generator submodule 540, and a direct root mean squared (RMS) measurement submodule 542. Submodules 534, 536, 538, 540, and 542 generate a processed signal stream 544 that includes a spectrum signal stream 546, an asynchronous waveforms signal stream 548, a synchronous waveforms signal stream 550, an enveloped waveforms signal stream 552, and a direct RMS signal stream 554.

Referring again to FIG. 6, front end data sources module 526 receives digital signal stream 432 and keyphasor signal stream 528 (shown in FIG. 7) and generates and transmits processed signal stream 544 to either one of SATA interface module 516 and signal processing core 413. Such selection is solely based on which of FPGA 408 and DSP 414 have the resources for calculating measurement data allocated by soft core processor 412 as described above.

For those circumstances where the resources of signal processing core 413 of FPGA 408 were allocated by soft core processor 412, i.e., both conditions of availability and configuration of core 413 are met, processed signal stream 544 is transmitted to the allocated signal processing core 413. Signal processing core 413 calculates measurement data from processed signal stream 544 through the measurement configuration data previously transmitted to core 413 through measurement data application configuration signals 506 as described above. Signal processing core 413 generates a measurement data signal stream 556 that is transmitted to FPGA database manager 514 to facilitate temporary storage in FPGA 408.

FPGA database manager 514 also maintains a list of DMA segment descriptors for the measurement data until a periodic DMA transfer takes place. At the time of data transfer, the measurement configuration data directs the CPU's DMA engine within CPU 215, via its DMA segment descriptor, thereby facilitating measurement data transfer. The measurement data result, in the form of binary measurement data signal stream 556, with a destination address, is transmitted from FPGA database manager 514 to current values database 510 in CPU 215 through PCIe interface 512, FPGA's memory module 410 (shown in FIGS. 4 and 5) and CPU memory module 402 (shown in FIGS. 4 and 5).

For those circumstances where the resources of one of DSPs 414 were allocated by soft core processor 412, i.e., one or both conditions of availability and configuration of core 413 are not met, processed signal stream 544 is transmitted to signal processor 522 through SATA interface module 516. Signal processor 522 calculates the measurement data from processed signal stream 544 through the measurement configuration data parsed into individual measurement data configuration constituents, i.e., signal processing object chains 520 that include individual measurement application properties, and the associated signal processing tree. Signal processor 522 generates a measurement data signal stream 558 that is transmitted to a small current values database 560 configured within DSP 414 for temporary storage. When directed, a measurement data packet stream 562 is transmitted FPGA database manager 514 through SATA interface module 516 and FPGA memory module 410. The measurement data result, in the form of binary measurement data signal stream 562, with a destination address, is transmitted from FPGA database manager 514 to current values database 510 in CPU 215 through PCIe interface 512, FPGA's memory module 410 and CPU memory module 402.

In the exemplary embodiment, beta testing of new and/or non-standard measurement data algorithms may be performed. As described above, signal processing core 413 of FPGA 408 calculates a first portion of measurement data for those algorithms that FPGA 408 is configured to execute and signal processing core 413 has sufficient resources to execute the algorithms. In general, such first portion of measurement data includes standard measurement data algorithms. Also, as described above, when signal processing core 413 is already allocated and is not presently available to accept additional standard measurement data algorithms and measurement data to execute, soft core processor 412 embedded within FPGA 408 manages signal transmission such that the plurality of DSPs 414 cooperate with each other such that at least one of DSPs 414 receives and calculates the first portion of measurement data. Further, as described above, when signal processing core 413 is not configured to execute a second portion of measurement data algorithms that are new and/or non-standard, soft core processor 412 manages signal transmission such that the plurality of DSPs 414 cooperate with each other such that at least one of DSPs 414 receives and calculates the second portion of measurement data.

Similarly, for those new and/or non-standard measurement data algorithms that have yet to be tested, soft core processor 412 manages signal transmission such that FPGA 408 does not receive the untested measurement data algorithms and at least one of DSPs 414 receives and tests such untested measurement data algorithms with real-time measurement data. Such beta testing is performed without interruption of the standard execution of measurement data algorithms by FPGA 408 and DSPs 414. CPU 215 configures soft core processor 412 to calculate this new measurement since no signal processing core 413 is configured for the new measurement. The allocated DSP 414 will then begin the measurement data calculations and transmit the calculated measurement data to CPU 215 with substantially no interference with the existing suite of measurements. Therefore, new diagnostic measurements may be non-interferingly added and removed "on-the-fly" with one of DSPs 414 without interfering with existing operation of DAS 200.

In contrast to known, conventional data acquisition systems (DASs), the computer-based data acquisition systems as described herein facilitate implementation of a dynamically configurable digital signal processing system. In contrast to known DASs, such system facilitates supporting a wide variety of standard industrial asset applications. For example, if a newly installed gas turbine engine requires only standard existing measurements, such a suite of measurement algorithms is downloaded and implemented therein. Also, for example, if an existing gas turbine engine requires one of more measurements for a new or enhanced support subsystem, standard measurement algorithms are downloaded and implemented therein. Therefore, in contrast to known, conventional DASs, substantially any combination of existing measurements are supported within the practical limits of the systems described herein due to the substantially unlimited configurability of the associated digital signal processors (DSPs) therein.

Further, in contrast to known, conventional DASs, if either of new, untested, and/or non-standard measurements are required for the industrial asset, a wide variety of options are available. For example, new and non-standard measurements may be added and removed "on-the fly" while not interfering with operation of the standard measurement calculations. Specifically, in contrast to known, conventional DASs, the DASs described herein leverage the multiple DSPs under the direction of the soft core processor embedded in the field-programmable gate array (FPGA) to distribute the processing work load as necessary. Such DSP management by the soft core processor facilitates the central processing unit (CPU) updating at least one of the DSPs with new firmware that generates and executes the new and non-standard measurement data algorithms.

Moreover, in contrast to known, conventional DASs, and in a manner similar to the "on-the-fly" measurements described above, the DASs described herein facilitate beta testing of untested new and non-standard measurements without interfering with existing standard measurement data calculations. For such beta testing, the soft core processor "designates" a beta testing DSP that cooperates with the CPU to execute the testing of the untested new and non-standard measurements.

Furthermore, in contrast to known, conventional DASs, the FPGA signal processing cores described herein are physically separated from the multiple DSPs, thereby increasing system reliability and protection such that, as new measurements are added, the existing diagnostic and measurement processes proceed uninterrupted.

An exemplary technical effect of the methods, systems, and apparatus described herein includes at least one of: (a) implementing measurement calculations in the software of dynamically configurable digital signal processing systems without first upgrading the firmware; (b) implementing measurement calculations in the software of dynamically configurable digital signal processing systems without interrupting ongoing standard measurement calculations; and (c) beta testing measurement calculations in the software of dynamically configurable digital signal processing systems without interrupting ongoing standard measurement calculations.

The methods and systems described herein are not limited to the specific embodiments described herein. For example, components of each system and/or steps of each method may be used and/or practiced independently and separately from other components and/or steps described herein. In addition, each component and/or step may also be used and/or practiced with other assemblies and methods.

Some embodiments involve the use of one or more electronic or computing devices. Such devices typically include a processor or controller, such as a general purpose central processing unit (CPU), a graphics processing unit (GPU), a microcontroller, a reduced instruction set computer (RISC) processor, an application specific integrated circuit (ASIC), a programmable logic circuit (PLC), and/or any other circuit or processor capable of executing the functions described herein. The methods described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term processor.

While the invention has been described in terms of various specific embodiments, those skilled in the art will recognize that the invention can be practiced with modification within the spirit and scope of the claims.

What is claimed is:

1. A data acquisition system (DAS) comprising:
   a central processing unit (CPU), wherein the CPU is configured to receive at least one configuration file and generate at least one measurement data application configuration signal from the at least one configuration file, wherein the at least one measurement data application configuration signal comprises information indicative of:
   a type of measurement data calculation to perform;
   and data acquired from one or more sensors configured to collect information regarding an industrial asset; and
   a field-programmable gate array (FPGA) including a first processor of a plurality of processors and a FPGA database manager,
   wherein the FPGA is coupled to the CPU;
   wherein the first processor of the plurality of processors is configured to:
   receive the at least one measurement data application configuration signal; and
   allocate at least a portion of the FPGA and at least one second processor of the plurality of processors to perform the first measurement data calculation based on the type of measurement data calculation indicated in the at least one measurement data application configuration signal and an availability of the at least a portion of the FPGA,
   wherein the FPGA database manager is configured to receive and store a result of the measurement data calculation; and
   send an additional set of instructions to simultaneously perform a second measurement data calculation with the at least one second processor of the plurality of processors on the data, the second measurement data calculation based on a second type of measurement data calculation, wherein the second type is untested;
   wherein the at least one second processor is configured to
   determine a result of the second measurement data calculation; and
   transmit the result of the second measurement data calculation to the CPU,
   wherein the at least one second processor is separate from, and performs the determining and transmitting independent of, the FPGA.

2. The DAS in accordance with claim 1, wherein the first processor of the plurality of processors comprises an embedded soft core processor.

3. The DAS in accordance with claim 1, wherein the FPGA comprises at least one signal processing core configured to perform a first portion of the first measurement data calculation.

4. The DAS in accordance with claim 3, wherein at least one second processor is configured to:
   perform the first portion of the first measurement data calculation when the at least one signal processing core of the FPGA is already allocated; and
   perform a second portion of the first measurement data calculation.

5. The DAS in accordance with claim 3, wherein the first processor is configured to coordinate cooperation between at least two of the plurality of processors to perform the first portion of the first measurement data calculation.

6. The DAS in accordance with claim 1, wherein the at least one second processor is a floating-point processor.

7. The DAS in accordance with claim 1, wherein the one or more sensors are configured to receive a measurement associated with the industrial asset.

8. The DAS in accordance with claim 7, wherein the one or more sensors are coupled to the plurality of processors through the FPGA.

9. A method of monitoring an asset, comprising:
   receiving, from the asset, a portion of measurement data;
   receiving, via a first processor of a plurality of processors, at least one measurement data application configuration signal from a central processing unit (CPU) configured to receive a configuration file and generate the at least one measurement data application configuration signal based on the configuration file, wherein the first processor is part of a field-programmable gate array (FPGA);
   allocating, via the first processor, at least one signal processing core of the FPGA and a portion of the plurality of processors to perform a first measurement data calculation on the portion of measurement data at least partially based on a first type of measurement data calculation indicated in the at least one measurement data application configuration signal and an availability of the at least one signal processing core of the FPGA;
   sending, via the first processor, instructions to the at least one signal processing core of the FPGA and the portion of the plurality of processors to perform the first measurement data calculation on the portion of measurement data;

transmitting, via the first processor, a result of the first measurement data calculation to a storage device from the at least one signal processing core of the FPGA and the portion of the plurality of processors;

sending, via the first processor, an additional set of instructions to simultaneously perform a second measurement data calculation with the portion of the plurality of processors on the portion of measurement data, the second measurement data calculation based on a second type of measurement data calculation, wherein the second type is untested;

determining a result of the second measurement data calculation; and transmitting, via the portion of the plurality of processors, the result of the second measurement data calculation to the CPU, wherein the portion of the plurality of processors is separate from, and performs the determining and transmitting of the result of the second measurement data calculation independent of, the FPGA.

10. A method in accordance with claim 9, wherein the first processor allocates the portion of the plurality of processors by allocating resources of the portion of the plurality of processors to perform the first measurement data calculation.

11. The method in accordance with claim 9, wherein allocating the at least one signal processing core of the FPGA comprises sending, via the first processor, a command to the at least one signal processing core to perform a first portion of the first measurement data calculation.

12. The method in accordance with claim 9, comprising sending, via the first processor, an additional set of instructions to the portion of the plurality of processors to perform a first portion of the first measurement data calculation when the at least one signal processing core of the FPGA is not configured to perform the first portion of the first measurement data calculation, wherein the portion of the plurality of processors is configured to perform a second portion of the first measurement data calculation when the at least one signal processing core of the FPGA is allocated to perform the measurement data calculation.

13. The method in accordance with claim 9, comprising sending, via the first processor, an additional set of instructions to simultaneously test a first set of measurement data applications with the portion of the plurality of processors, wherein the at least one signal processing core of the FPGA is configured to perform a first portion of the first measurement data calculation with a second set of measurement data applications.

14. The method in accordance with claim 9, wherein the portion of the plurality of processors is configured to perform the first measurement data calculation with floating-point math.

15. The method in accordance with claim 9, comprising:
receiving, via the first processor, one or more signals substantially representative of a measurement from at least one monitoring sensor associated with an industrial asset; and
performing, via the first processor, the first measurement data calculation with the portion of the plurality of processors based on the one or more signals.

16. An industrial facility, comprising:
at least one industrial asset; and
a data acquisition system (DAS) comprising:
at least one monitoring sensor coupled to the at least one industrial asset, wherein the at least one monitoring sensor is configured to receive signals substantially representative of at least one asset measurement;
a central processing unit (CPU) configured to receive at least one configuration file and generate at least one measurement data application configuration signal from the at least one configuration file;
a field-programmable gate array (FPGA) coupled to the CPU and the at least one monitoring sensor, wherein the FPGA includes a FPGA database manager and a first processor, the first processor configured to:
receive the at least one measurement data application configuration signal;
allocate at least one signal processing core of the FPGA to perform a first measurement data calculation based at least partially on a type of measurement data calculation indicated in the at least one measurement data application signal and an availability of the at least one signal processing core of the FPGA, wherein the FPGA database manager is configured to receive and store a result of the first measurement data calculation;
send an additional set of instructions to simultaneously perform a second measurement data calculation with a plurality of second processors on the signals, the plurality of second processors operably coupled to the FPGA and the CPU, the second measurement data calculation based on a second type of measurement data calculation, wherein the second type is untested,
wherein the plurality of second processors is configured to
determine a result of the second measurement data calculation; and
transmit, via the plurality of second processors, the result of the second measurement data calculation to the CPU,
wherein the plurality of second processors is separate from and performs the determining and transmitting independent of the FPGA.

17. The industrial facility in accordance with claim 16, wherein the first processor comprises an embedded soft core processor.

18. The industrial facility in accordance with claim 16, wherein the at least one signal processing core of the FPGA is configured to perform a first portion of the first measurement data calculation.

19. The industrial facility in accordance with claim 18, wherein the first processor is configured to:
send instructions to at least one of the plurality of second processors to perform the first portion of the first measurement data calculation when the at least one signal processing core of the FPGA is already allocated; and
send at least one of the plurality of processors instructions to perform a second portion of the first measurement data calculation when the at least one signal processing core of the FPGA is not configured to calculate the second portion of the measurement data calculation.

20. The industrial facility in accordance with claim 18, wherein the processor is configured to send instructions to at least of the portion of the plurality of processors perform a second portion of the first measurement data calculation when the at least one signal processing core of the FPGA is not configured to calculate the second portion of the measurement data calculation.

* * * * *